United States Patent
Wu et al.

(10) Patent No.: US 9,762,833 B1
(45) Date of Patent: Sep. 12, 2017

(54) ADAPTIVE BODY BIASING CIRCUIT FOR LATCH-UP PREVENTION

(71) Applicant: OMNIVISION TECHNOLOGIES, INC., Santa Clara, CA (US)

(72) Inventors: Charles Qingle Wu, Palo Alto, CA (US); Yun Hak Koh, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/163,582

(22) Filed: May 24, 2016

(51) Int. Cl.
*H04N 5/374* (2011.01)
*H03K 19/00* (2006.01)
*H03K 19/003* (2006.01)

(52) U.S. Cl.
CPC ..... *H04N 5/3741* (2013.01); *H03K 19/00315* (2013.01)

(58) Field of Classification Search
CPC .. H04N 5/3741; H04N 5/3742; H04N 5/3765; H04N 5/376; H03K 19/00315
See application file for complete search history.

(56) References Cited

U.S. PATENT DOCUMENTS

| | | | |
|---|---|---|---|
| 7,514,953 B2 | 4/2009 | Perisetty | |
| 8,772,694 B2 * | 7/2014 | Sugano | H04N 5/3532 250/208.1 |
| 2007/0205802 A1 * | 9/2007 | Perisetty | H03K 19/00315 326/27 |
| 2009/0153219 A1 * | 6/2009 | Wu | H03K 19/018528 327/333 |
| 2013/0235242 A1 * | 9/2013 | Watanabe | H04N 5/374 348/308 |
| 2014/0132592 A1 * | 5/2014 | Liu | H04B 1/04 345/214 |
| 2014/0307513 A1 * | 10/2014 | Chun | H03K 19/0013 365/189.09 |
| 2015/0124133 A1 * | 5/2015 | Kawazu | H04N 5/378 348/296 |
| 2015/0249449 A1 * | 9/2015 | Cai | H03K 19/0016 327/436 |
| 2015/0264288 A1 * | 9/2015 | Okamoto | H04N 5/376 250/208.1 |
| 2017/0013216 A1 * | 1/2017 | Bol | H04N 5/365 |

* cited by examiner

Primary Examiner — Jason Flohre
(74) Attorney, Agent, or Firm — Christensen O'Connor; Johnson Kindness PLLC

(57) ABSTRACT

Techniques and methods for reducing or preventing latch up in row decoder circuits are disclosed herein. An example apparatus may include an array of pixels, a row address decoder, and control circuitry. The row decode circuit including a plurality of decode circuits, each including at least two transistors having respective body terminals coupled to a first node. The control circuitry including a body biasing circuit coupled to the first node, the body biasing circuit to adaptively provide a bias voltage to the first node in response to an operating state of the imaging system and/or a change in one of two reference voltages based on a control signal provided by a bias control circuit.

20 Claims, 4 Drawing Sheets

US 9,762,833 B1

ADAPTIVE BODY BIASING CIRCUIT FOR LATCH-UP PREVENTION

TECHNICAL FIELD

This disclosure relates generally to transistor biasing, and in particular but not exclusively, relates to transistor body biasing for prevention of latch-up.

BACKGROUND INFORMATION

Image sensors are ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

As with many semiconductor-based devices, such as image sensors, latch up is a concern for device performance and reliability. Latch up may occur for various reasons related to die layout, relative placement of n-wells, p-wells, highly doped regions, etc., and how those various areas become biased with respect to one another. While latch up is not a recent issue, the solutions that have long been viewed as industry standard may not always be amenable to further miniaturization of semiconductor devices, including image sensors.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
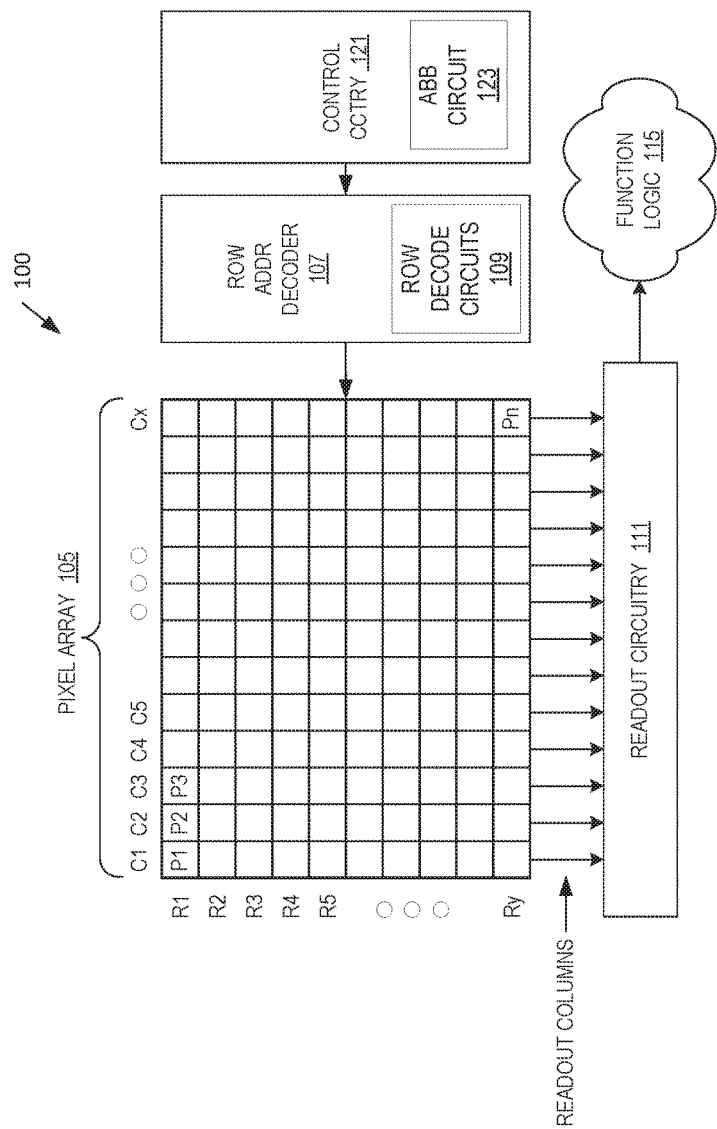
FIG. 1 is a block diagram illustrating one example of an imaging system, in accordance with an embodiment of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with an adaptive body biasing circuit are described herein. An example body biasing circuit may adaptively couple one of two voltage reference sources to a body terminal of row address decode circuits responsive to an operating state of the image sensor, and further responsive to a relative voltage level of the two voltage reference sources. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 illustrates one example of an imaging system 100 in accordance with an embodiment of the present disclosure. Imaging system 100 includes pixel array 105, row address decoder 107, control circuitry 121, readout circuitry 111, and function logic 115. The control circuitry 121 may include an adaptive body biasing (ABB) circuit 123. In one example, pixel array 105 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 105 has acquired its image data or image charge, the image data is readout by readout circuitry 111 and then transferred to function logic 115. Readout circuitry 111 may be coupled to readout image data from the plurality of photodiodes in pixel array 105. In various examples, readout circuitry 111 may include amplification circuitry, analog-to-digital (ADC) conversion circuitry, or otherwise. Function logic 115 may simply store the image data or even manipulate the image data by applying post image effects (e.g., crop, rotate, remove red eye, adjust brightness, adjust contrast, or otherwise). In one example, readout circuitry 111 may readout a row of image data at a time along readout column lines (illustrated) or may readout the image data using a variety of other techniques (not illustrated), such as a serial readout or a full parallel readout of all pixels simultaneously.

In one example, control circuitry 121 is coupled to pixel array 105 through the row address decoder 107 to control operation of the plurality of photodiodes in pixel array 105. For example, control circuitry 121 may generate a shutter signal for controlling image acquisition, which may be provided to the row address decoder 107 for implementing the image acquisition based at least in part on the shutter signal. In one example, the shutter signal is a global shutter signal for simultaneously enabling all pixels within pixel array 105 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, row address decoder 107 may include a plurality of row decode circuits 109, with one row decode circuit 109 for each row of pixels in the pixel array 105. Further, each row decode circuit 109 may include at least one or more transistors to control the reset of and operating state of a respective row of pixels. The transistors may be NMOS transistors, PMOS transistors, or a combination thereof. In some examples, the one or more transistors of the row decode circuits 109 may be PMOS transistors. The row decode circuits 109, however, may be susceptible to latch up based at least in part on a voltage applied to body terminals of their respective transistors.

In some examples, latch up may occur if their body terminals are coupled to a voltage that is lower than a voltage level of a low reference voltage source. To reduce or eliminate the chance of latch up, the ABB circuit 123 may monitor the operating state of the imaging system 100 and the relative voltage levels of the low reference voltage source and a high reference voltage source. In response, the ABB circuit 123 may adaptively adjust which of the two reference voltage sources are coupled to the body terminals of the row decode circuits 109, e.g., the ABB circuit 123 may adaptively bias the row decode circuits 109. The adaptive biasing may occur if there is a change in an operating state and/or a change in a relative voltage level of the high and low reference voltage sources.

In some examples, the ABB circuit 123 may couple the low reference voltage source to body terminals of the row decode circuits 109 when the imaging system 100 is in a power down operating state. However, during a power up operating state, the ABB circuit 123 may couple the high reference voltage to the body terminals. In some examples, the high reference voltage may be generated from the low reference voltage by way of one or more charge pumps. Due to charge pump variability, there may be instances when the voltage level provided by the charge pump may be less than the voltage level of the low reference voltage source. As such, the ABB circuit 123 may compare, while in power up, the voltage level of high reference voltage to the voltage level of low reference voltage, and adaptively couple the larger of the two to the body terminals of the row decode circuits 109. In some embodiments, the voltage level of the high voltage reference may fall below the voltage level of the low voltage reference if the high voltage reference becomes coupled to ground, such as due to a short for example. As such, the ABB circuit 123, during the power up operating state, may monitor the voltage levels of the high and low voltage reference sources so that if the voltage level of the high voltage source falls below the voltage level of the low voltage source, the ABB circuit 123 may couple the low voltage source to the body terminals of the row decode circuits 109. By preventing the body terminals of the row decode circuits 109 from being coupled to a voltage less than the low reference voltage source, the chance of latch up may be reduced or eliminated.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
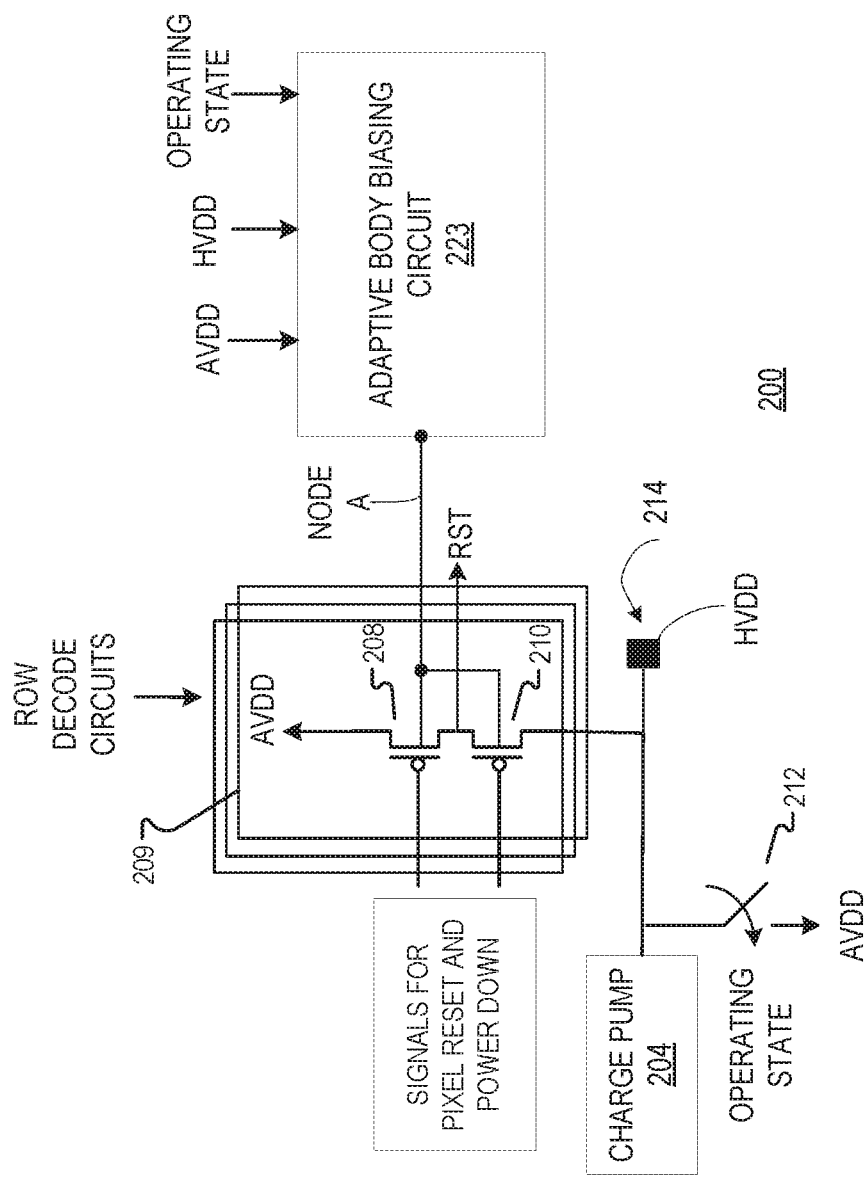
FIG. 2 is an illustrative schematic of a portion of an image system including an adaptive body bias circuit, in accordance with an embodiment of the present disclosure.

FIG. 2 is an illustrative schematic of one example of a portion of an imaging system 200 including an adaptive body biasing circuit in accordance with an embodiment of the present disclosure. The illustrated portion of the imaging system 200 is shown to include a plurality of row decode circuits 209, a charge pump 204, and an adaptive body biasing (ABB) circuit 223. The ABB circuit 223, which may be an example of the ABB circuit 123 of the imaging system 100, may adaptively couple a first or second reference voltage to each of the plurality of row decode circuits 207 responsive to an operating state of the portion of the imaging system 200, and/or responsive to a relative voltage level between the first second reference voltages. Adaptively coupling one of the two reference voltages may be performed in order to reduce or eliminate the chance of latch up occurring in the transistors of the row decode circuits 209. Adaptive coupling may additionally occur if a voltage source providing the second reference voltage becomes shorted to ground, for example, due to a current discharge operation.

The illustrative example of the plurality of row decode circuits 209 is shown to include two PMOS transistors, transistors 208 and 210. While other circuitry may be included in the row decode circuits 209, the other circuitry is omitted herein for the sake of clarity. The transistors 208 and 210 may be coupled in series between AVDD, a first reference voltage, and HVDD, a second reference voltage. The reference voltages may be provided by respective reference voltage sources. A source of the transistor 208 may be coupled to receive the reference voltage AVDD, and a drain of the transistor 210 may be coupled to receive the reference voltage HVDD. Further, a drain of the transistor 208 may be coupled to a source of the transistor 210. Body terminals of the transistors 208 and 210 may be coupled together and further coupled to node A.

The gate terminals of the transistors 208 and 210 may be coupled to receive a signal or signals that enable/disable different combinations of the two transistors to cause either a reset signal RST to be generated or to indicate an operating state of the imaging system 200. The operating states may be power up and power down. Specifically, the source and drain coupling of the two transistors 208, 210 may provide the reset signal RST in response to a signal or a combination of signals received on gates of the transistors 208, 210. The reset signal RST may be provided to pixels or a row of pixels of a pixel array, such as the pixel array 105, to reset their charge storage node between exposures of the respective photodiode, for example.

Additionally, the signal indicating the operating state may cause a switch 212 between transistor 210 and the AVDD voltage source to open or close. For example, if the signal indicates a power down state, the switch 212 may close to connect the AVDD voltage source to the drain of the transistor 210. During power down, the charge pump 204 may be disabled, and as a result the HVDD reference voltage provided by the charge pump 204 may be less than a desired level and/or zero.

In some embodiments, the transistors 208, 210 of the row decode circuits 209 may be susceptible to latch up based at least in part on a voltage applied to their body terminals relative to voltages applied to the other terminals of the transistors. In some examples, latch up may occur if their body terminals are coupled to a voltage that is lower than a voltage of the reference voltage AVDD, which may be coupled to the source of the transistor 208 for example. To reduce or eliminate the chance of latch up, the ABB circuit 223 may monitor the operating state of the imaging system 200 and the relative voltage levels of the AVDD reference voltage and an HVDD reference voltage. The ABB circuit 223 may adaptively adjust the reference voltage source coupled to the body terminals of the transistors 208, 210 via node A based on an operating state and/or a relative voltage level of the two reference voltages.

The charge pump 204 may provide, e.g., generate, the reference voltage HVDD. In some examples, the charge pump 204 may generate HVDD based on AVDD. In some embodiments, a voltage level of HVDD may be higher than a voltage level of AVDD. For example, AVDD may be around 2.8 volts, whereas HVDD may be around 3.6 volts. While the imaging system 200 is in the power down operating state, charge pump 204 may be disabled, and as a result, the high reference voltage HVDD may no longer be provided by the charge pump 204.

In some examples, the voltage level of HVDD provided by the charge pump 204 may not consistently be at a desired level, and may, on occasion, fall below the voltage level of AVDD. For example, the voltage level of HVDD may vary over time due to the variability of charge pump 204. In one example, the charge pump 204 may take time to provide the full HVDD voltage at power up, e.g., the output of the charge pump 204 may take time to ramp up from zero to the desired level of HVDD. Although while in power down the drain of the transistor 210 may be coupled to AVDD via switch 212, for some period of time at initiation of power up, switch 212 may open, and the voltage provided by the charge pump 204 may initially be less than the desired level of HVDD as the charge pump 204 begins to generate the HVDD reference voltage. Accordingly, there may exist at least two potential instances where latch up may occur due to the voltage level of HVDD being less than the voltage level of AVDD—(1) at the beginning of power up when the charge pump 204 is increasing the output level of HVDD to the desired level, and (2) during times the charge pump 204 is improperly operating resulting in a low voltage level for HVDD.

To mitigate the chance of latch up, the ABB circuit 223 may monitor both the operating state of the imaging system 200 and the voltage level of HVDD, and in response to either or both of those variables, adaptively couple either AVDD or HVDD to the body terminals of the PMOS transistors 208 and 210. The ABB circuit 223 may have at least three inputs and an output, the output of which may be coupled to node A. The three inputs may be coupled to receive AVDD, HVDD, and the signal indicating the operating state of the imaging system 200. In some examples, the signal indicating the operating state may be at a low logic level, e.g., "0," to indicate power up, and at a high logic level, e.g., "1," to indicate power down. However, the opposite convention may also be used. The ABB circuit 223 may include circuits having one or more transistors and one or more logic gates to adaptively bias node A, and by extension the body terminals of the transistors 208 and 210 with either AVDD or HVDD in response to the operating state of the imaging system 200 and/or the relative voltage levels of AVDD and HVDD.

For example, while in the power down state, the ABB circuit 223 may couple AVDD to node A. To extend the example, while in the power up state, the ABB circuit 223 may couple either AVDD or HVDD to node A responsive to which of the two reference voltages are at a higher voltage level. During power up, the ABB circuit 223 may compare the voltage levels of the two reference voltages, and couple the higher of the two voltages to node A. In addition to the charge pump variability that may cause the voltage level of HVDD to fall below the voltage level of AVDD, the HVDD pad 214 may become shorted to ground, for example, which may cause the voltage level of HVDD to fall below the voltage level of AVDD. In some embodiments, the HVDD pad 214 may be shorted to ground due to a current discharge operating mode. However, due to ABB circuit 223 monitoring the relative voltage levels provided by AVDD and HVDD, the body terminals may be coupled to the greater of the two in the event the voltage level HVDD falls below the voltage level of AVDD. In general, the ABB circuit 223, at least while in the power up operating state, monitors the voltage level of the two voltage reference sources, such as AVDD and HVDD, and adaptively couples the higher of the two to the body terminals of the row decode circuits 209 to ensure the desired operation of the circuits.

In some examples, the ABB circuit 223 may be described as having two portions—a bias or coupling portion, and a control portion. The bias portion to couple reference voltages to body terminals of row decode circuit transistors, and the control portion to control when and what reference voltage to couple. However, while the ABB circuit 223 may be described as having two portions for ease of description, the ABB circuit 223 may generally be a single circuit capable of coupling one or two voltages to each of the row decode circuits 209 responsive to an operating state of the image system 200 and/or a relative voltage level of the reference voltages. Although the discussion of the ABB circuit 223 uses two reference voltages as an example, the number of reference voltages is a non-limiting aspect of the present disclosure, and any number of voltage levels are contemplated.

Figure 3:
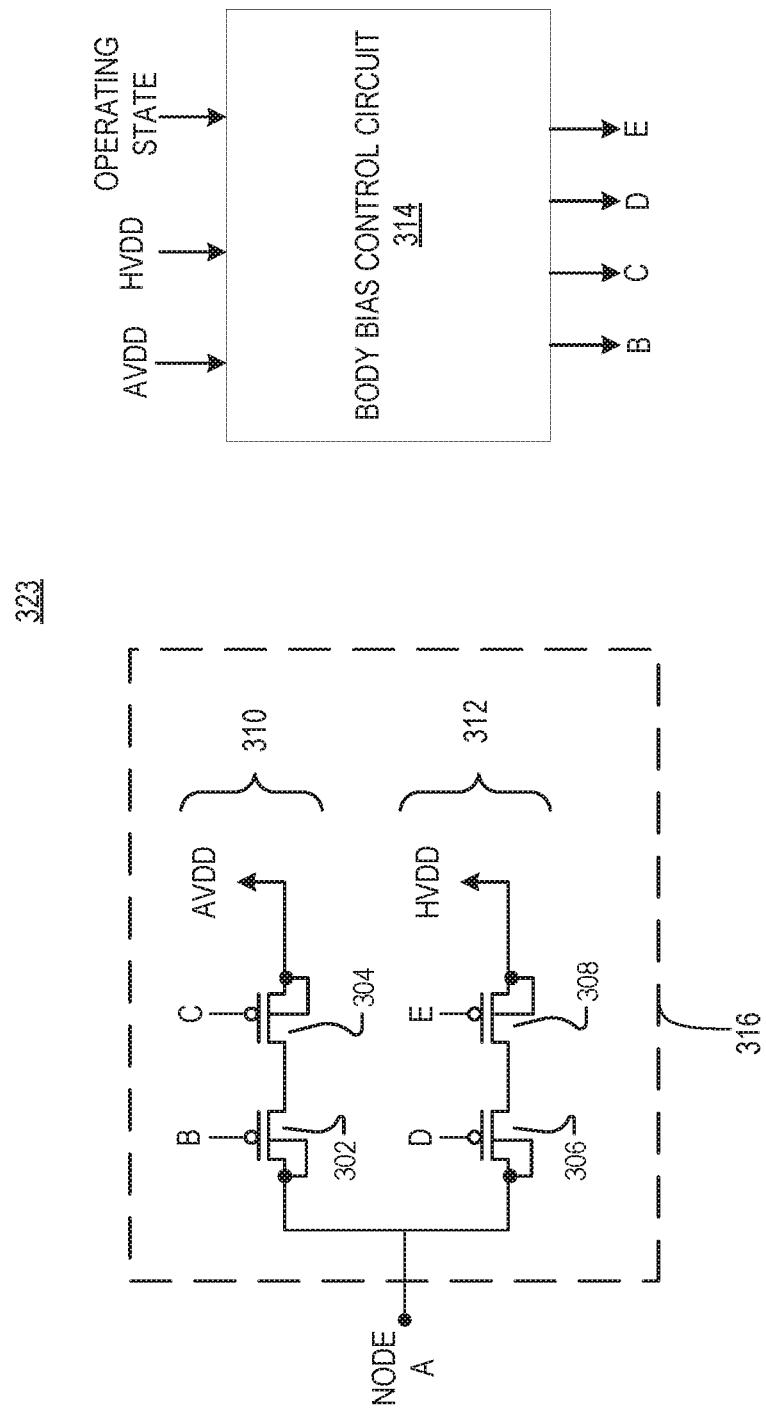
FIG. 3 is a schematic of a body biasing circuit, in accordance with the teachings of the present invention.

FIG. 3 is a schematic of one example of an adaptive body biasing circuit 323 in accordance with an embodiment of the present disclosure. The adaptive body biasing (ABB) circuit 323 may be an example of the ABB circuit 223 and ABB circuit 123. The illustrative example of the ABB circuit 323 is shown to include a body bias circuit 316 and a body bias control circuit 314. The body bias circuit 316 is shown to include four PMOS transistors—transistors 302, 304, 306, and 308—arranged substantially as shown in FIG. 3. By selectively enabling and disabling subsets of the four transistors, the body bias circuit 316 may couple one of two reference voltages to node A. The selective coupling of the reference voltages may be controlled by the control circuit 314.

The illustrative example of the body bias circuit 316 is shown to include the transistors 302 and 304 coupled in series between the node A and a first reference voltage AVDD. Also included are the transistors 306 and 308 coupled in series between the node A and a second reference voltage HVDD. In some examples, the voltage level of reference voltage AVDD may be lower than the voltage level of reference voltage HVDD. The series coupled transistors 302 and 304 may form a first biasing path 310, and the series coupled transistors 306 and 308 may form a second biasing path 312.

First biasing path 310 may include the series coupled transistors 302 and 304, and may be selectively enabled to couple AVDD to node A. As shown, the transistor 302 may be coupled to the node A by a source, and further coupled to a drain of the transistor 304 by a drain. A gate of the transistor 302 may be coupled to receive a control signal B from control circuit 314. The control signal B may enable and disable the transistor 302. The transistor 304 may be coupled to the reference voltage AVDD by a source, and a gate of the transistor 304 may be coupled to receive a control signal C from control circuit 314, the control signal C capable of enabling/disabling the transistor 304.

Second biasing path 312 may include the series coupled transistors 306 and 308, and may be selectively enabled to couple HVDD to node A. The transistor 306 may be coupled to the node A by a source, and further coupled to a drain of the transistor 308 by a drain. A gate of the transistor 306 may be coupled to receive a control signal D from bias control circuit 314. The control signal may enable and disable the transistor 306. The transistor 308 may be coupled to the reference voltage HVDD by a source, and a gate of the transistor 308 may be coupled to receive a control signal E from control logic, the control signal E capable of enabling/disabling the transistor 308.

The first and second biasing paths 310 and 312 through enablement and disablement of their respective transistors may selectively couple either AVDD or HVDD to node A. Whether the first biasing path 310 or second biasing path 312 is enabled or disabled may be based on control signals B, C, D, and E provided by the body bias control circuit 314. In general, which transistors are enabled and which are disabled may be responsive to an operating state of a host system, such as the imaging system 100 or 200, and further responsive to relative voltage levels of AVDD and HVDD.

The body bias control circuit 314 may control the body bias circuit 316 in response to a signal indicating an operating state, and a voltage level of the reference voltage HVDD relative to a voltage level of the reference voltage AVDD. The body bias control circuit 314 may provide the control signals B, C, D, and E. As such, if the operating state signal indicates a power down state, body bias control circuit 314 may provide control signals B and C to enable the first biasing path 310, and provide control signals D and E to disable the second biasing path 312. In the event the operating state indicates a power up state, the control circuit 314 may, based on determining that a voltage level of HVDD is greater than a voltage level of AVDD, provide control signals to enable the second biasing path 312, and disable the first biasing path 310. However, if body bias control circuit 314 determines that the voltage level of HVDD is less than the voltage level of AVDD while in the power up state, the body bias control circuit 314 may provide control signals to enable the first biasing path 310 and disable the second biasing path 312.

Coupling AVDD to node A during power down or when the voltage level of HVDD is less than the voltage level of AVDD during power up may prevent or reduce the chance of latch up by transistors of row decode circuits, such as the transistors 208 and 210 of the row decode circuits 209, for example. Other occurrences may also cause the voltage level of HVDD to be less than the voltage level of AVDD, such as a current discharge operation of the HVDD causing its voltage level to be low.

Figure 4:
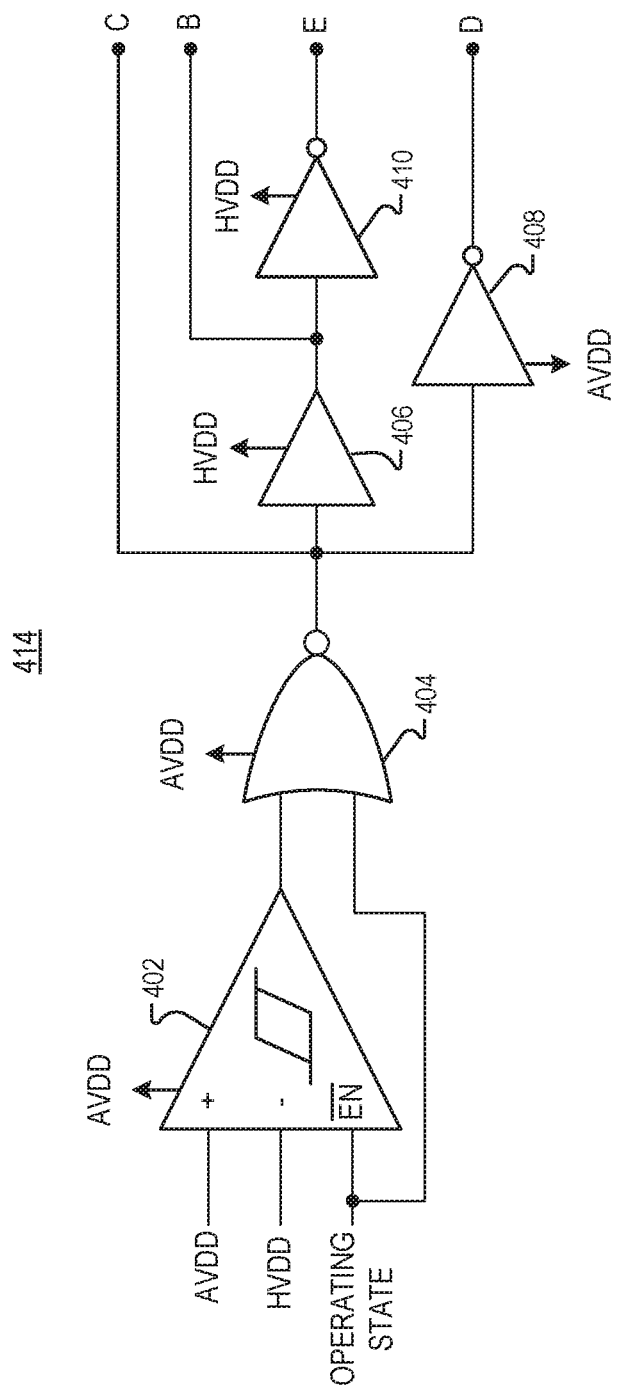
FIG. 4 is a schematic of a body biasing control circuit, in accordance with an embodiment of the present disclosure.

FIG. 4 is a schematic of one example of a body bias control circuit 414 in accordance with an embodiment of the present disclosure. The body bias control circuit 414 may be an example of the body bias control circuit 314. The body bias control circuit 414 may provide control signals to selectively couple one of two reference voltage sources to body terminals of row decoder circuit transistors via a body bias circuit, such as the body bias circuit 316. The illustrative body bias control circuit 414 is shown to include a comparator 402, a NOR gate 404, a level shifter 406, and first and second inverters 408 and 410. The body bias control circuit 414, responsive to voltage levels of reference voltages AVDD and HVDD and further in response to a signal indicative of an operating state of a host system, such as the imaging system 100 or 200, may provide sets of control signals for coupling either AVDD or HVDD through a body bias circuit, such as the body bias circuit 316.

The comparator 402, which may have hysteresis, may have a non-inverting input, an inverting input, and an enabling input. In some examples, the comparator 402 may be biased by the AVDD reference voltage. The non-inverting input may be coupled to receive the reference voltage AVDD, and the inverting input may be coupled to receive the reference voltage HVDD. The enabling input may be coupled to receive a signal indicative of an operating state of the host system, such signal may indicate whether the host system or at least part of the host system is to be in a power up or power down operating state. When the comparator 402 is enabled responsive to the signal indicating the power up operating state, the comparator 402 may compare the voltage levels of AVDD and HVDD, and, in response, provide an output indicating whether the voltage level of HVDD is greater than or less than AVDD. However, when the comparator 402 is disabled responsive to the signal indicating the power down operating state, the comparator 402 may place its output into a high impedance state or provide a low logic level output, e.g., a zero voltage signal.

The NOR gate 404, which may be biased by the AVDD reference voltage, may have one input coupled to the output of the comparator 402, and another input coupled to receive the signal indicative of the operating state of the host system. The output of the NOR gate 404 may be coupled to an input of the level shifter 406, and may also provide a control signal on an output C. In operation, an output signal provided by the NOR gate 404 may be based on the two inputs, and a high logic level signal may be based on the AVDD reference voltage.

The level shifter 406, which may be biased by the HVDD reference voltage, may have an input coupled to the output of the NOR gate 404. An output of the level shifter 406 may provide a control signal on an output B. The level shifter 406, which may operate as a buffer, may shift a voltage level of an input signal from a voltage level based on AVDD to a voltage level based on HVDD. In general, and as one skilled in the art would understand, the voltage shift may only occur for signals having a high logic level, e.g., a "1," which may be represented by a signal having a high voltage.

The first inverter 408, which may be biased by AVDD, may have an input coupled to the output of the NOR gate 404, and provide a control signal on an output D. The second inverter 410, which may be biased by HVDD, may have an input coupled to an output of the level shifter 406, and provide a control signal on an output E.

The bias body control circuit 414 may provide four outputs, such as outputs B, C, D, and E. Signals provided by the four outputs may be control signals provided to a body bias circuit, such as the body bias circuit 316. For example, the output B may be coupled to the gate of the transistor 302, and provide an enabling/disabling control signal to the transistor 302. Likewise, output C may be coupled to the gate of transistor 304, output D coupled to the gate of transistor 306, and output E coupled to the gate of transistor 308.

In operation and using a low logic level signal, e.g., a "0," to indicate power up, and a high logic level signal, e.g., a "1," to indicate power down, and further having the comparator 402 output a low logic level signal when the voltage of HVDD is greater than the voltage of AVDD, the following logic table for the body bias control circuit 414 is derived. For the NOR gate 404 inputs, the number on the left represents the output of the comparator 402, and the number on the right represents the signal indicative of the operating state, e.g., "0" for power up and "1" for power down.

| NOR gate Input | Output B | Output C | Output D | Output E |
|---|---|---|---|---|
| 0 0 | HVDD | AVDD | 0 | 0 |
| 0 1 | 0 | 0 | AVDD | HVVDD |
| 1 0 | 0 | 0 | AVDD | HVVDD |
| 1 1 | 0 | 0 | AVDD | HVVDD |

Based on the above table, when the signal indicting the operating state is "1," e.g., power down, outputs B and C may be low, e.g., zero volts, and outputs D and E may be high, e.g., HVDD and AVDD, respectively. This combination of control signals may enable transistors 302 and 304 and disable transistors 306 and 308. It should be noted that the transistors 302-308 are PMOS transistors and, as such, may be enabled when a low voltage is coupled to their gate terminals, and disabled when a high voltage is coupled. Consequently, the reference voltage AVDD may be coupled to node A whereas reference voltage HVDD may be decoupled from node A.

Additionally, when the signal indicating the operating state is "0," e.g., power up, the outputs of B, C, D, and E, may be affected by the output of the comparator 402. For example, if the voltage level of HVDD is determined to be greater than the voltage level of AVDD, which may result in a low output by the comparator 402, outputs B and C may be high, e.g., HVDD and AVDD, respectively, and outputs D and E may be low, e.g., zero volts. This combination of control signals may disable transistors 302 and 304, and enable transistors 306 and 308. As such, the body bias circuit 316 may couple HVDD to node A. However, if the voltage level of HVDD is determined to be less than the voltage level of AVDD, which may result in a high output by the comparator 402, outputs B and C may be low, e.g., zero volts, and outputs D and E may be high, e.g., HVDD and AVDD, respectively. This combination of control signals enables transistors 302 and 304 and disables transistors 306 and 308. Although the system may be in power up, the bias control circuit 414 may cause the body bias circuit 316 to couple AVDD to node A.

The combination of the body bias circuit 316 and the body bias control circuit 414 may be an example of the ABB circuit 123 of FIG. 1 and ABB circuit 223 of FIG. 2. The combination of the body bias circuit 316 and the body bias control circuit 414 may be included in an imaging system, such as the imaging system 100 for example, to prevent or reduce the chance of latch up from occurring within PMOS transistors of row address decode circuits, for example.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An imaging system, comprising:
   an array of pixels formed into columns and rows, each row including a plurality of pixels;
   a row address decoder including a plurality of decode circuits, each of the plurality of decode circuits coupled to a respective row of pixels, and each decode circuit of the plurality of decode circuits including at least two transistors coupled together by respective body terminals, and wherein the coupled body terminals of the two transistors of each of the plurality of decode circuits are coupled to a first node; and
   control circuitry coupled to the row address decoder, the control circuitry including a body biasing circuit coupled to the first node, the body biasing circuit to adaptively provide a bias voltage to the first node in response to an operating state of the imaging system, the body biasing circuit including:
      a bias circuit coupled between the first node and first and second reference voltage sources, the bias circuit to selectively couple either the first or second reference voltage source to the first node in response to a control signal, wherein the bias circuit includes:
         first and second transistors coupled in series between the first node and the first reference voltage source; and
         third and fourth transistors coupled in series between the first node and the second reference voltage source; and
      a bias control circuit coupled to the bias circuit, the first and second reference voltage sources and further coupled to receive a signal indicative of the operating state,
   wherein, in response to the imaging system being in a first operating state, the bias control circuit is coupled to provide control signals to enable the third and fourth transistors to couple the second reference voltage source to the first node, and disable the first and second transistors, and
   wherein, in response to the imaging system being in a second operating state, the bias control circuit is coupled to provide control signals to enable the first and second transistors to couple the first reference voltage source to the first node, and disable the third and fourth transistors.

2. The imaging system of claim 1, wherein the first operating state indicates the imaging system is powered up and the second operating state indicates the imaging system is powered down.

3. The imaging system of claim 1, wherein the bias control circuit includes:
   a comparator having a non-inverting input coupled to an output of the first reference voltage source, an inverting input coupled to an output of the second reference voltage source, and an enabling input coupled to receive the signal indicative of the operating state, and the comparator having an output;
   a NOR gate having a first input coupled to the output of the comparator, and a second input coupled to receive the signal indicative of the operating state, and the NOR gate having an output coupled to a gate of the second transistor;

a first inverter having an input coupled to the output of the NOR gate, and an output coupled to a gate of the third transistor;

a level shifter having an input coupled to the output of the NOR gate, the level shifter coupled to shift a voltage level of the output of the NOR gate to a voltage level of the second reference voltage source, and wherein the level shifter has an output coupled to a gate of the first transistor; and a second inverter having an input coupled to the output of the level shifter, and an output coupled to a gate of the fourth transistor.

4. The imaging system of claim 3, wherein the comparator, the NOR gate and the first inverter are biased by the first reference voltage source, and wherein the level shifter and the second inverter are biased by the second reference voltage source.

5. The imaging system of claim 3, wherein in response to the imaging system being in the first operating state, the comparator determines whether a voltage level of the second voltage source is greater than a voltage level of the first voltage source, and the bias control circuit couples the first or second voltage source having the greater voltage level to the first node in response to the determination.

6. The imaging system of claim 1, wherein the first reference voltage source is a low voltage and the second reference voltage source is a high voltage.

7. The imaging system of claim 1, wherein the first, second, third, and fourth transistors are PMOS transistors.

8. An adaptive body biasing circuit of an imaging system, comprising:
a bias circuit including:
a first node coupled to a body of each of a plurality of PMOS transistors;
a first transistor having a source, a drain, and a gate;
a second transistor having a source, a drain, and a gate, wherein the source of the second transistor is coupled to a first reference voltage source, and the drain of the second transistor is coupled to the drain of the first transistor, and the source of the first transistor is coupled to the first node;
a third transistor having a source, a drain, and a gate; and
a fourth transistor having a source, a drain, and a gate, wherein the source of the fourth transistor is coupled to a second reference voltage source, and the drain of the fourth transistor is coupled to the drain of the third transistor, and the source of the third transistor is coupled to the first node; and
a bias control circuit coupled to the bias circuit, the bias circuit coupled to the first reference voltage source, the second reference voltage source, and further coupled to receive a signal indicative of an operating state of the imaging system, the bias control circuit coupled to enable the first and second transistors and disable the third and fourth transistors in response to receiving a signal indicating a first operating state, and further coupled to enable the third and fourth transistors and disable the first and second transistors in response to receiving a signal indicating a second operating state.

9. The adaptive body biasing circuit of claim 8, wherein, in response to the imaging system being in the second operating state, the bias control circuit further compares a voltage level of the second reference voltage source to a voltage level of the first reference voltage source and enables the bias circuit so that the first or second reference voltage having the greater voltage level is coupled to the first node.

10. The adaptive body biasing circuit of claim 8, wherein the bias control circuit includes:
a comparator having three inputs and an output, wherein a non-inverting input is couple to the first reference voltage source, an inverting input is coupled to the second reference voltage source, and an enabling input is coupled to receive the signal indicating the operating state, and wherein the comparator provides a signal in response to a comparison of a voltage level of the first and second reference voltages in response to the comparator being enabled;
a NOR gate having two inputs and an output, wherein a first input is coupled to the output of the comparator and a second input is coupled to receive the signal indicating the operating state, wherein the output of the NOR gate is coupled to the gate of the second transistor;
a first inverter biased by the first reference voltage source, the first inverter having an input and an output, wherein the input is coupled to the output of the NOR gate, and the output is coupled to the gate of the third transistor;
a level shifter biased by the second reference voltage source, the level shifter having an input and an output, and configured to shift a voltage level of an input signal to a voltage level of the second reference voltage source, wherein the input is coupled to the output of the NOR gate, and the output is coupled to the gate of the first transistor; and
a second inverter biased by the second reference voltage, the second inverter having an input and an output, wherein the input is coupled to the output of the level shifter, and the output is coupled to the gate of the fourth transistor.

11. The adaptive body biasing circuit of claim 10, wherein the first operating state is a power down state, and wherein, in response to the power down state, the comparator is disabled, the output of the NOR gate is at a low logic level, which causes the output of the level shifter to be at a low logic level, and wherein the outputs of the NOR gate and the level shifter enable the first and second transistors.

12. The adaptive body biasing circuit of claim 11, wherein, in response to the power down state, the outputs of the first and second inverters are at a high logic level to cause the third and fourth transistors to be disabled.

13. The adaptive body biasing circuit of claim 10, wherein the second operating state is a power up state, and wherein, in response to the power up state, the comparator is enabled and compares voltage levels of the first and second reference voltage sources, and provides a low logic level when the voltage level of the second reference voltage is greater than the voltage level of the first reference voltage, and wherein the NOR gate provides a high logic level output in response to the low logic level output of the comparator and being in the power up state, the high logic level output of the NOR gate causes the first and second transistors to be disabled and the outputs of the first and second inverters to be at a low logic level to cause the third and fourth transistors to be enabled.

14. The adaptive body biasing circuit of claim 13, wherein, during the power up state, the output of the comparator is at a high logic level when the voltage level of the second reference voltage is less than the first reference voltage, which causes the first and second transistors to be enabled and the third and fourth transistors to be disabled.

15. The adaptive body biasing circuit of claim 8, wherein the first reference voltage is a low reference voltage and wherein the second reference voltage is a high reference voltage.

16. The adaptive body biasing circuit of claim 8, wherein the first through fourth transistors are PMOS transistors.

17. An apparatus, comprising:
a body bias circuit to couple either a first reference voltage source or a second reference voltage source to an output node in response to a set of control signals; and
a bias control circuit coupled to the body bias circuit and configured to provide sets of control signals based at least in part on an operating state of the apparatus, the bias control circuit including:
a comparator having at least a first input coupled to receive a signal indicative of the operating state;
a NOR gate having a first input coupled to the output of the comparator, a second input coupled to receive the signal indicative of the operating state, and an output coupled to provide a first control signal;
a first inverter having an input coupled to the output of the NOR gate and an output coupled to provide a second control signal;
a level shifter having an input coupled to the output of the NOR gate, and an output coupled to provide a third control signal; and
a second inverter having an input coupled to the output of the level shifter, and an output coupled to provide a fourth control signal,
wherein, in response to the apparatus being in a first operating state, the control logic is configured to provide a first set of control signals to the body bias circuit to cause the body bias circuit to couple the first voltage reference source to the output node, wherein the first set of control signals includes the first and second control signals being enabling and the third and fourth control signals being disabling,
wherein, in response to the apparatus being in a second operating state, the control logic is configured to provide a second set of control signals to the body bias circuit to cause the body bias circuit to couple the second voltage reference source to the output node, wherein the second set of control signals includes the first and second control signals being disabling and the third and fourth control signals being enabling.

18. The apparatus of claim 17, wherein the first operating state is a power down state and the second operating state is a power up state.

19. The apparatus of claim 17, wherein the comparator further has second and third inputs, the second input being a non-inverting input coupled to the first reference voltage source, and the third input being an inverting input coupled to the second reference voltage source, and wherein, in response to the apparatus being in the second operating state, the comparator determines whether a voltage level of the second reference voltage is greater than the first reference voltage, and in response to the voltage level of the second reference voltage being less than the voltage level of the first reference voltage, the output of the comparator causes the control circuit to provide the first set of control signals.

20. The apparatus of claim 17, wherein the body bias circuit includes:
a first transistor having a source, a drain, and a gate, the gate coupled to the output of the level shifter to receive the third control signal;
a second transistor having a source, a drain, and a gate, wherein the source of the second transistor is coupled to a first reference voltage, and the drain of the second transistor is coupled to the drain of the first transistor, and the source of the first transistor is coupled to the first node, and wherein the gate of the second transistor is coupled to the output of the NOR gate to receive the first control signal;
a third transistor having a source, a drain, and a gate, the gate coupled to the output of the first inverter to receive the second control signal; and
a fourth transistor having a source, a drain, and a gate, wherein the source of the fourth transistor is coupled to a second reference voltage, and the drain of the fourth transistor is coupled to the drain of the third transistor, and the source of the third transistor is coupled to the first node, and wherein the gate of the fourth transistor is coupled to the output of the second inverter to receive the fourth control signal,
wherein the first set of control signals enables the first and second transistors and disables the third and fourth transistors, and
wherein the second set of control signals enable the third and fourth transistors and disable the first and second transistors.

* * * * *